(12) United States Patent
Boulais et al.

(10) Patent No.: US 9,753,185 B2
(45) Date of Patent: Sep. 5, 2017

(54) LIGHT GUIDE FILM CONTROL FOR OPTICALLY TUNABLE METAMATERIALS

(71) Applicants: Kevin A. Boulais, La Plate, MD (US); Francisco Santiago, Spring Hill, FL (US); Charles E. Mannix, Ruther Glen, VA (US)

(72) Inventors: Kevin A. Boulais, La Plate, MD (US); Francisco Santiago, Spring Hill, FL (US); Charles E. Mannix, Ruther Glen, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/830,628

(22) Filed: Aug. 19, 2015

(65) Prior Publication Data

US 2017/0075038 A1    Mar. 16, 2017

(51) Int. Cl.
| | |
|---|---|
| *G02B 1/00* | (2006.01) |
| *G02B 6/00* | (2006.01) |
| *F21V 7/04* | (2006.01) |
| *F21V 8/00* | (2006.01) |
| *H01L 31/09* | (2006.01) |

(Continued)

(52) U.S. Cl.
CPC .......... *G02B 1/002* (2013.01); *G02B 6/0011* (2013.01); *G02B 6/0043* (2013.01); *H01L 31/09* (2013.01);
(Continued)

(58) Field of Classification Search
CPC ........ G02B 1/002; G02B 5/0278; G02B 5/08; G02B 5/30; G02B 6/0011; G02B 6/0041; G02B 6/0043; G02B 6/0035; G02B 6/0036; G02B 6/0066; G02B 6/0073; H01L 31/02002; H01L 31/02016; H01L 31/09;
(Continued)

(56) References Cited

U.S. PATENT DOCUMENTS

| | | | |
|---|---|---|---|
| 7,408,707 B2 * | 8/2008 | Yeo | G02B 5/0242 348/771 |
| 7,525,711 B1 | 4/2009 | Rule et al. | 359/244 |

(Continued)

OTHER PUBLICATIONS

P. Rayms-Keller et al.: "Optically Controllable Composite Dielectric Based on Photo-Conductive Particulates", *IEEE Trans. on Microwave Theory and Techniques* 62 (7) (2014).

*Primary Examiner* — Loha Ben
(74) *Attorney, Agent, or Firm* — Gerhard W. Thielman, Esq.

(57) ABSTRACT

A metamaterial control device is provided for controlling electromagnetic radiation. The device uses a light-guide film (LGF), with the LGF being capable of receiving light emission along an edge. The device includes a substrate disposed on a non-edges surface of the LGF, electromagnetic cellular structures that are controllable, and an optically sensitive component within some or all cells. The substrate is composed of metamaterial and having an interface that corresponds to an extractor on the non-edge surface for scattering light therefrom. Alternatively, the substrate can constitute the LGF itself. The cell structure is disposed around the extractor. The optically sensitive component is disposed to cover the extractor. The component changes in response to receiving the light from the extractor and changes in response to intensity of the light.

13 Claims, 4 Drawing Sheets

(51) Int. Cl.
*G02F 1/00* (2006.01)
*F21V 7/00* (2006.01)

(52) U.S. Cl.
CPC ............... *F21V 7/0008* (2013.01); *F21V 7/04* (2013.01); *G02B 6/0036* (2013.01); *G02B 6/0066* (2013.01); *G02B 6/0073* (2013.01); *G02F 1/0009* (2013.01)

(58) Field of Classification Search
CPC ............ G02F 1/0009; G02F 1/133602; G02F 1/133603; F21V 7/0008; F21V 7/04
USPC ....... 359/237, 240–245, 299, 460, 599, 615; 362/600, 602, 606, 608, 612, 615, 362/617–619, 622, 627, 629; 600/310, 600/317
See application file for complete search history.

(56) References Cited

U.S. PATENT DOCUMENTS

| | | | | |
|---|---|---|---|---|
| 7,741,933 | B2 | 6/2010 | Duwel et al. | 333/187 |
| 7,864,394 | B1 | 1/2011 | Rule et al. | 359/244 |
| 8,400,225 | B1 | 3/2013 | Sessions et al. | 331/83 |
| 8,599,489 | B2 | 12/2013 | Shalaev et al. | 359/665 |
| 8,693,158 | B2 | 4/2014 | Chew et al. | 361/139 |
| 8,784,704 | B2 | 7/2014 | Boulais et al. | 252/600 |
| 9,028,123 | B2 * | 5/2015 | Nichol | G02B 6/0076 349/63 |
| 9,151,891 | B2 * | 10/2015 | Ma | B82Y 20/00 |
| 9,470,819 | B2 * | 10/2016 | Ren | G02B 1/002 |
| 9,523,807 | B2 * | 12/2016 | Nichol | G02B 6/0018 |
| 9,581,854 | B2 * | 2/2017 | Ren | H01L 33/38 |
| 2015/0002854 | A1 | 1/2015 | Laine et al. | 356/510 |

* cited by examiner

LIGHT GUIDE FILM CONTROL FOR OPTICALLY TUNABLE METAMATERIALS

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to light-guide films and more specifically to a mechanism for guiding light to individual cells in a group within an optically controllable metamaterial, metasurface, frequency selective surface, reflect-array or other such electromagnetic structures, all of which will be assumed in this disclosure with the term metamaterial. Edge lighting has been used for commercial signs, such as described in U.S. Pat. No. 1,139,723.

Light-guide films have been used to illuminate alphanumeric and other symbolic characters in electronic devices using an illumination source directed through the edge of the film and directed through select regions of the display surface. FIG. 1 shows a cross-sectional view 100 of a conventional light-guide planar structure 110. A transparent substrate that forms a light-guide film (LGF) 120 includes protrusions, indentations, or other structures called extractors 130 that extend from a planar surface. An illumination source 140 emits light 150 that enters an edge of the substrate 120 and through refraction and reflection exists as scattered light 160 from the extractors 130. Artisans of ordinary skill will note that light can be input into the film using any number of processes and from an edge or from a surface, and extracted or inserted using various forms of extractors.

Electromagnetic (EM) metamaterials constitute synthetic materials based on cellular elements that act to polarize electric and/or magnetic fields. Often resonant behavior is used to enhance polarization, but resonance typically leads to single frequency, or limited bandwidth use. The utility of a metamaterial could be enhanced dramatically if it were dynamically controllable over a range of frequencies. Often, the resonance is based on an electrical resonant circuit such as an inductor-capacitor circuit. Tuning can be accomplished by any capacitance, inductance, conductance or active circuit. Unless otherwise stated, the term capacitance will be employed herein but it should be known other techniques can be used.

An optimal way to control an EM metamaterial is by using photons in any portion of the frequency spectrum in which light guide film can be used, including infrared, visible and ultraviolet. This is because such photons can have a wavelength distinct from the EM radiation the metamaterial was designed for, e.g., infrared light to control a radio frequency (RF) metamaterial. Example methods for optically controlling a metamaterial has been described in U.S. Pat. No. 7,525,711 using photosensitive capacitance to modify the capacitive gap in a tunable spit-ring resonator. This technique is also described by K. A. Boulais et al.: "Tunable split-ring resonator for metamaterials using photocapacitance of semi-insulating GaAs," *Appl. Phys. Lett.*, 93 (4), 2008. The split-ring resonator constitutes an inductive-capacitive circuit and represents a magnetic cell in an EM metamaterial.

Other methods are described by J. Y. Chen et al.: "Comparative Analysis of Split-Ring Resonators for Tunable Negative Permeability Metamaterials Based on Anisotropic Dielectric Substrates," *Progress in Electromagnetics Research M*, v. 10, pp. 25-38, 2009 and by Y. S. Kivshar: "Nonlinear and tunable metamaeterials," in *Metamaterials: Fundamentals and Applications II*. A more recent example using photodiodes connected to varactors is by I. V. Shadrivov et al.: "Metamaterials Controlled with Light," *Phys. Rev. Lett.*, 109, 083902, 2012. In this latter work, a photodiode generates a voltage that in turn biases the varactor, which is a voltage controlled capacitance. In any of these optical schemes, a method must be employed that efficiently carries light to the photosensitive device. Another method involves using photosensitive ink such as that described by Kevin A. Boulais, et al.: "Optically Controllable Composite Dielectric Based on Photo-Conductive Particulates," *IEEE Trans on Microwave Theory and Techniques*, 62 (7), July 2014 and U.S. Pat. No. 8,784,704.

SUMMARY

Conventional capacitance devices that utilize electrical control yield disadvantages addressed by various exemplary embodiments of the present invention. In particular, conventional electrical control implies conductors are disposed within the metamaterial to operate the electrically controlled capacitors. Such conductors can interfere with the electromagnetic radiation that the metamaterial was designed to interact with. In some cases, the conductors can be made part of the metamaterial but this technique restricts the metamaterial design, and therefore limits its utility.

Exemplary embodiments provide a device disposable on a light-guide film (LGF), with the LGF being capable of receiving light emission along an edge. The device includes a substrate disposed on a facial non-edge surface of the LGF, a cellular element that interacts with the electromagnetic radiation such as a split ring resonator, an electromagnetic patch, or other such cell structure, and an optically sensitive tuning element that can be a capacitor, an inductor, a conductor or even an active component such as an operational amplifier. The substrate can be separate from the LGF, or can constitute the LGF itself. The cell structure is disposed on the resonator around the extractor such that the light emanating from the extractor controls the cell structure, For example, for a resonator as the structure, the device can be used to change the resonant frequency.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, those of ordinary skill in the art will readily recognize that devices of a less general purpose nature, such as hardwired devices, or the like, may also be used without departing from the scope and spirit of the inventive concepts disclosed herewith. General purpose machines include devices that execute instruction code. A hardwired device may constitute an application specific integrated circuit (ASIC), a field programmable gate array (FPGA), digital signal processor (DSP) or other related component.

Various exemplary embodiments provide a mechanism to channel light to each of the cells in a controllable metamaterial using light-guide film (LGF), which is a known technology using edge illumination. LGF is often used to distribute light on a planar surface in a controlled manner. For example, LGF is often used in flat panel monitors to make the screen appear uniformly lit, even though it is really illuminated only around the edges.

The mechanism that controls the light is tiny scattering "bumps" or "indentations" on the upper or lower surface of the LGF 120, as shown in view 100. By controlling the density, shape or size of the bumps, protrusions or indentations that form the extractors 130, light from source 140 can illuminate a surface in any desirable manner and can be infrared, visible and/or ultraviolet. In a display panel, the extractors 130 can be distributed in such a manner that as light intensity diminishes towards the center of the LGF display area, more extractors 130 are added to scatter more light, which compensates for attenuation, thereby providing a uniformly lit display panel. Other applications utilize LGF, such as in keypads and in advertising, as an efficient means to emit light where desired.

Figure 1:
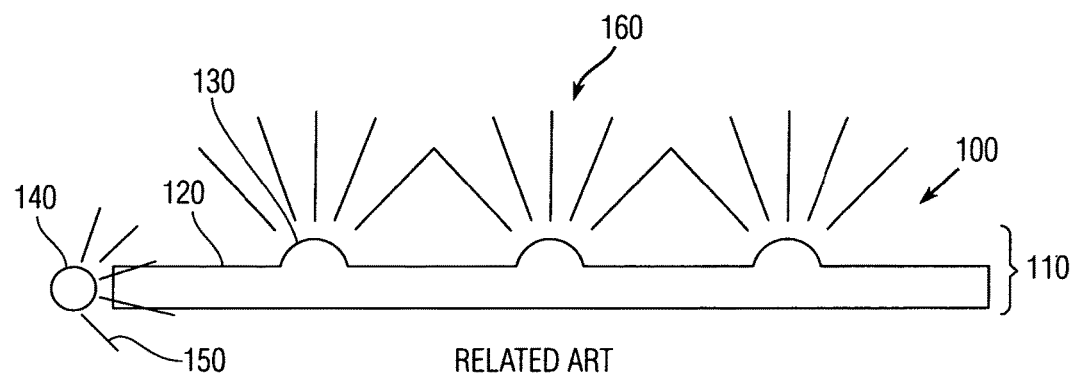
FIG. 1 is an elevation cross-section view of a conventional light-guide device that uses protrusions for extractors.
Figure 2:
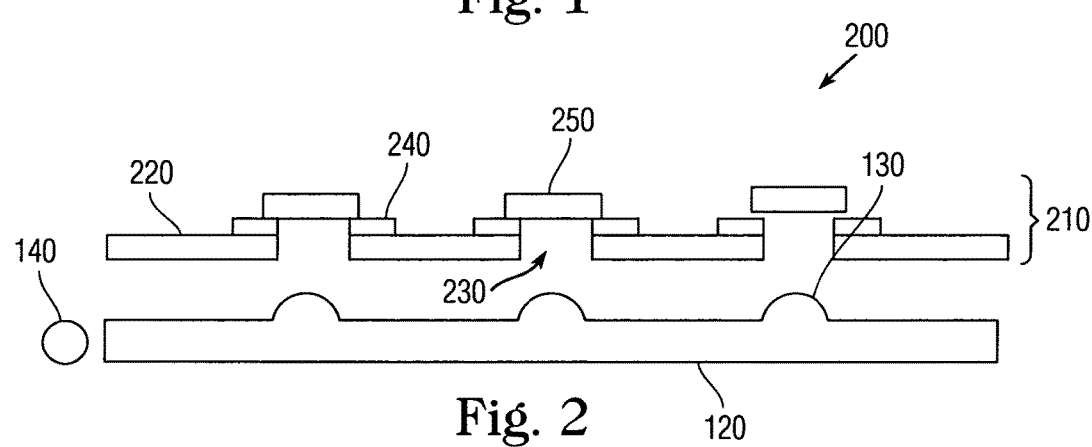
FIG. 2 is an elevation cross-section view of an exemplary metamaterial assembly for the light-guide device.

FIG. 2 shows a cross-sectional view 200 of an exemplary meta-material control assembly 210 activated by the light-guide 110. A metamaterial substrate 220 includes interface gaps 230 over which the extractors 130 can be fit into. An electromagnetic cellular structure 240 can be disposed around each gap 230. The cellular structure 240 can be a split-ring resonator or pad radiator or other such device. The edge light source 140 can be a light emitting diode (LED) to emit light through the LGF 120 as the transparent substrate.

The light source 140 can alternatively be a fluorescent light or some other light emitting means. An optically sensitive component 250 can be disposed over the corresponding cell structure 240 to receive scattered light 160 from the respective extractor 130 through the cavities formed by the gaps 230.

A metamaterial provides a structure to produce non-natural electromagnetic characteristics, such as negative permittivity and/or negative permeability. A metasurface can be used to control the electromagnetic impedance of that surface and thereby change phase and amplitude of a reflected wave. Frequency selective surfaces and reflecting arrays can also be used for this purpose, and when controlled with light can be made to steer electromagnetic beams reflected off of, or transmitted through their surface. A split-ring resonator is an artificially produced structure to yield desired magnetic susceptibility (i.e., magnetic response) in various types of metamaterials.

Figure 3:
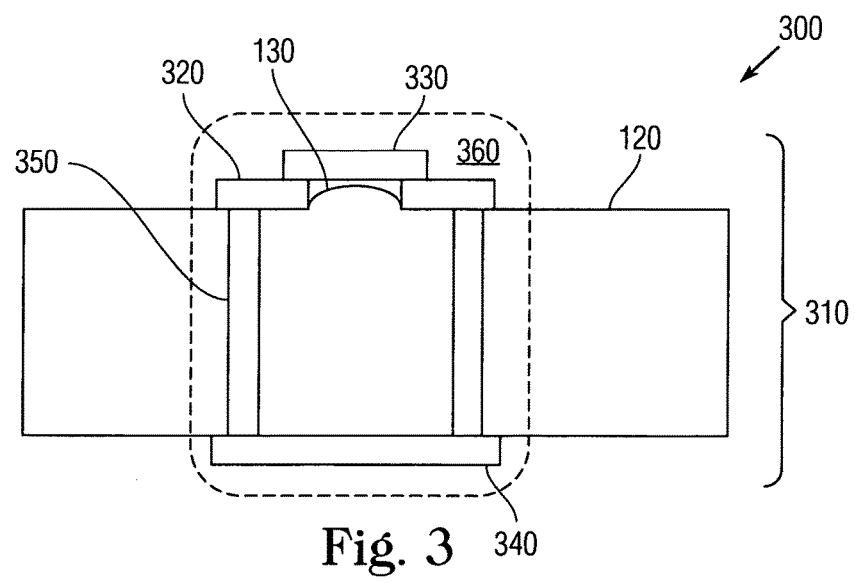
FIG. 3 is an elevation cross-section view of an exemplary metamaterial and light-guide assembly with a split ring resonator built into the light guide film.

FIG. 3 shows a cross-sectional view 300 of an alternative exemplary metamaterial and light-guide assembly 310 with the light-guide 110. Each extractor 130 is enveloped by a metamaterial split-ring resonator 320 and overlaid by an optically sensitive capacitor 330. A junction 340 provides a contact for controlling another device. Vias 350 traverse through the LGF 120 to connect the split-ring resonator 320 with the junction 340. Light scattered from the extractors 130 energizes the capacitor 330 to accumulate charge until discharging through the resonator 320 and the junction 340.

A photo-capacitive cell 360 constitutes a combination device of the metamaterial split-ring resonator 320, optically sensitive capacitor 330, the extractor 130 from the LGF 120, the vias 350 and the junction 340. Artisans of ordinary skill can note that all components can also be printed entirely on the surface of the light guide film, which then acts as both the light transmission source and the metamaterial. Conductive inks can be used for conductive cellular patterns, and tunable inks can be used as the optical control mechanism.

The LGF 120 can be illuminated in ways other than by edge lighting. Also, the split-ring resonators 240 do not need to be fabricated in the same plane as the LGF 120. Instead split-ring resonators 320 can be fabricated using vias 350 within the LGF 120 under designs in which the vias 350 do not interfere with the edge illumination. Other cell structures can be fabricated on the surface or within the material and any such structure should be included within this invention. An example concept is illustrated in view 300 demonstrating that the split-ring resonators 320 can be fabricated to be transverse to the parallel planes of the LGF 120. Other configurations can be used, and the same techniques can be used for resonators that interact mostly with an electric field as well.

An LGF is an ideal device to illuminate the photosensitive areas, corresponding to the gaps 230 in an optically controllable metamaterial, such as the substrate 220. Scattering extractors 130 can be restrictively disposed in the optically active regions rendering this technique efficient and controllable. The bump density of the extractors 130 can be controlled such that all cells 360 in the controllable metamaterial assembly 310 behave homogeneously. Alternatively, gradients of light intensity can be transmitted through the LGF 120 to form gradients in the metamaterial substrate 220 and metamaterial split-ring resonator 320 for such applications as gradient index lenses, for example.

An example of the light-guide 110 used in a metamaterial application is shown in view 200. Stacks of LGF metamaterial sheets can be combined to fabricate a three dimensional controllable metamaterial assembly 310. The LGF 120 can extend from one or more sides and combined so that a single illumination source can be used, for example in view 200.

The LGF metamaterial assembly 310 need not be uniform, but can effectively be fabricated in strips. This design offers control of each cell individually, or groups of cells 360 where each strip acts independently from other strips. Such strips simulate, for example, the manner that multiple fiber optics can guide light without mutual interference. The LGF metamaterial assembly 310 can be made flexible so as to conform to different shapes or temporally re-shaped as desired. Any optically controllable or electro-optically controllable mechanism can be used as an active cellular component illustrated as the cell 360.

Figure 4:
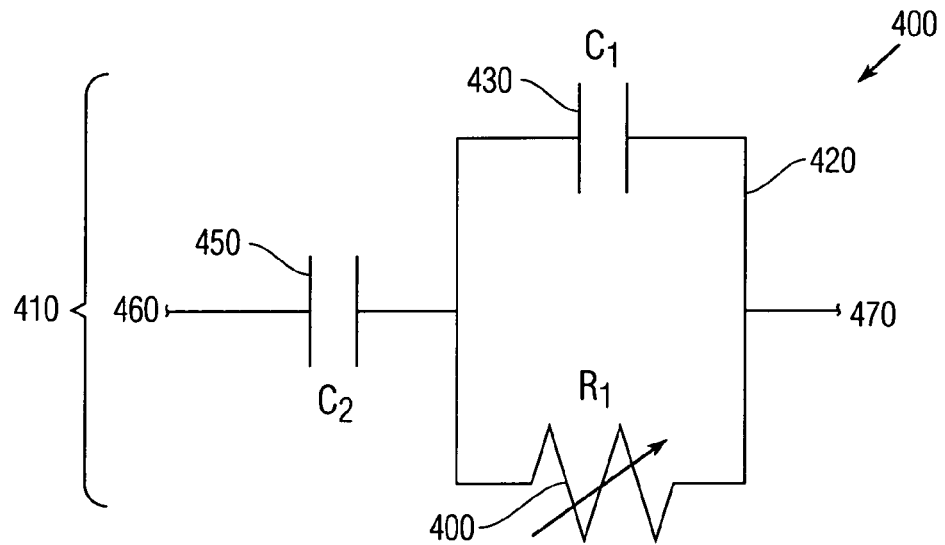
FIG. 4 is a schematic view of a variable capacitance circuit adjustable using photoconductance.

Some examples for electro-optical control are listed in the references previously described (photosensitive capacitance, varactor, etc.). FIG. 4 shows a schematic view 400 of a capacitance circuit 410, which can be used to tune capacitance by actually tuning resistance. The circuit 410 provides parallel components 420 that include a first capacitor 430 and a variable resistor 440. The circuit also includes a second capacitor between input voltage 460 and the parallel components 420, with output voltage at 470. The circuit enables variable capacitance that is adjustable using photoconductance in the first resistor 440.

Figure 5:
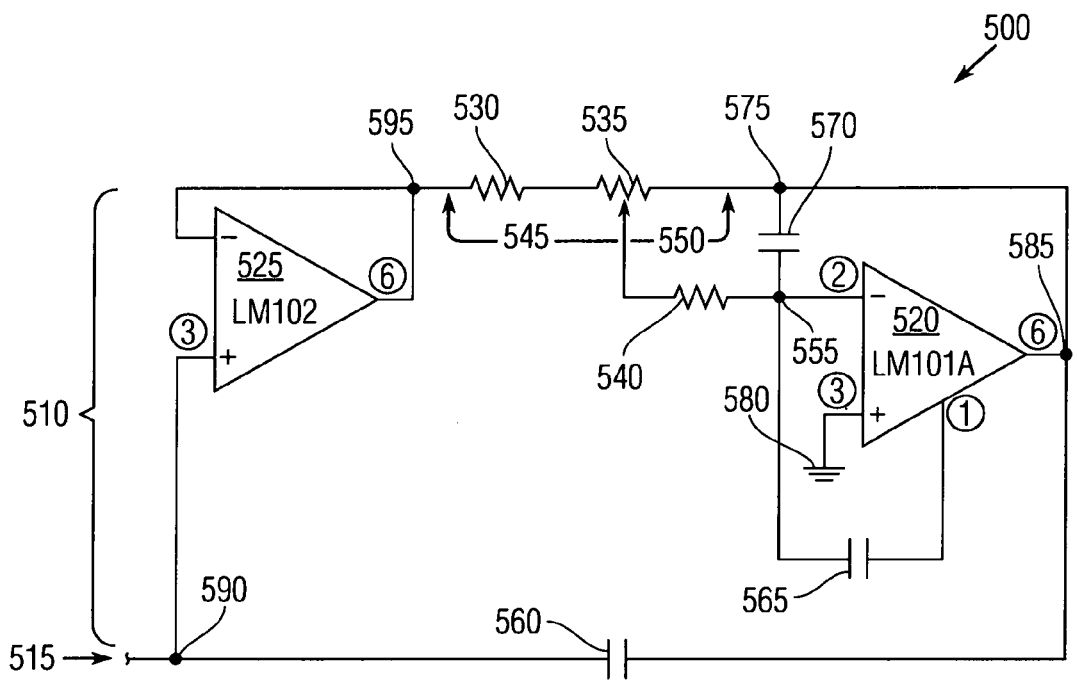
FIG. 5 is a schematic view of a variable capacitance amplifier circuit.

FIG. 5 shows a schematic view 500 of a variable capacitance amplifier circuit 510 from National Semiconductor application note AN-31. The circuit 510 receives a charge input 515 and includes operational amplifiers 520 and 525. The circuit 510 includes resistors $R_1$ 530 at 1 kΩ, variable $R_2$ 535 at 10 kΩ, $R_3$ 540 at 2 kΩ, $R_a$ 545 and $R_Q$ 550 that combine $R_1$ and $R_2$, a first node 555 that joins $R_3$ to the amplifier 520, a capacitor $C_1$ 560 at 0.1 µF, second capacitor $C_2$ 565 at 150 pF, a third capacitor $C_3$ 570 at 10 pF, a second node 575, ground 580 at the amplifier 520, and third, fourth and fifth nodes 585, 590 and 595. This variable capacitance multiplier circuit 510 can be used in the gap of a split-ring resonator 240 to control a metamaterial substrate 220. A separate layer of light guide film can be used to energize the circuit with the use of photovoltaic devices.

The discrete photosensitive capacitor 410 mimics the semiconductor version that includes two capacitors and a resistor that can be a photoresistor, and the photocapacitive ink method, for example. When combined, the effective series resistance $R_s$ is:

$$R_s = \frac{1}{C_1} \frac{\tau_1}{1+(\omega\tau_1)^2}, \quad (1)$$

where ω is angular circuit frequency, $C_1$ is the first capacitor, and time constant is $\tau_1 = R_1 C_1$. Series capacitance $C_s$ is:

$$C_s = \frac{C_1 C_2}{C_1 + C_2 \frac{(\omega\tau_1)^2}{1+(\omega\tau_1)^2}}, \quad (2)$$

where $C_2$ is second capacitor. The effective series capacitance $C_s$ can be controlled through first resistor $R_1$, which in turn modifies time constant $\tau_1$. This circuit has the advantage of capacitive response being linear with voltage. Thus EM field strength is such that the metamaterial doesn't generate EM harmonics.

Figure 6:
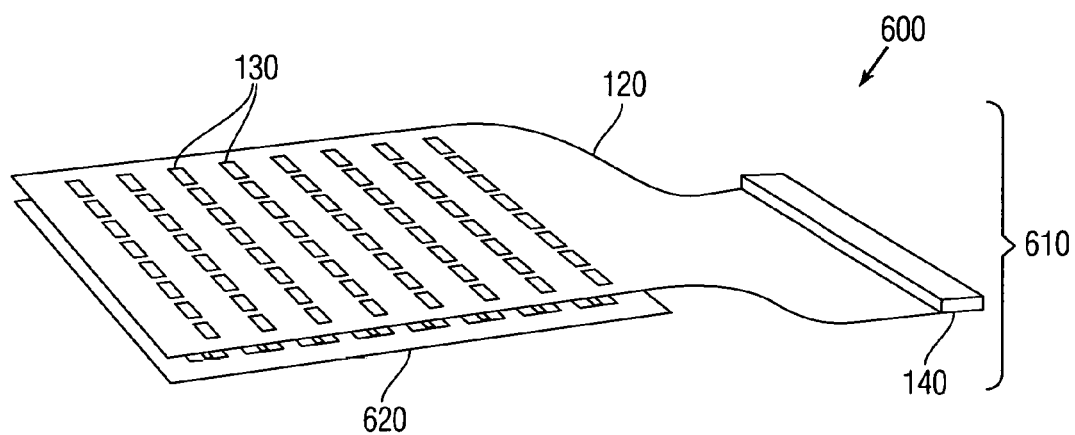
FIG. 6 is an isometric view of a light guide control assembly.

FIG. 6 shows an isometric view 600 of an exemplary metamaterial control assembly 610. The light source 140 provides illumination through the LGF 120, which scatters light through the extractors 130 to a tunable metasurface 620. Note that materials can be combined so as to be fabricated with LGF 120 as a substrate.

Figure 7:
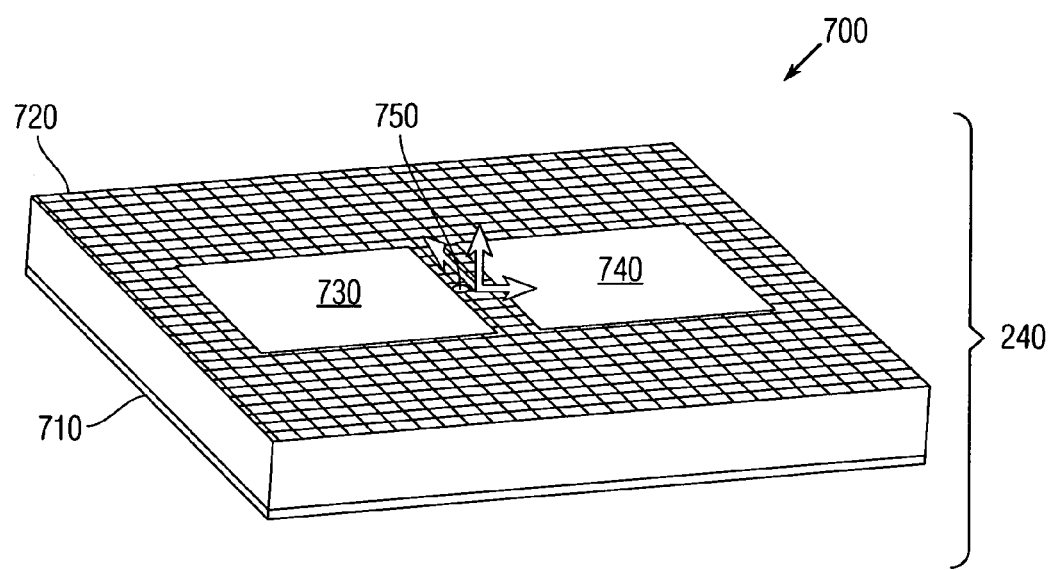
FIG. 7 is a schematic view of a electromagnetic cellular structure.

FIG. 7 shows an isometric view 700 of an exemplary cellular structure 240. A metallic backplane 710 provides a conductive mounting surface for a dielectric substrate 720. First and second metallic patches 730 and 740 are disposed on the substrate 720 and connected by a conduit 750 composed of photocapacitive ink or alternative tuning element. The substrate 720 can be composed of a polymer.

Figure 8:
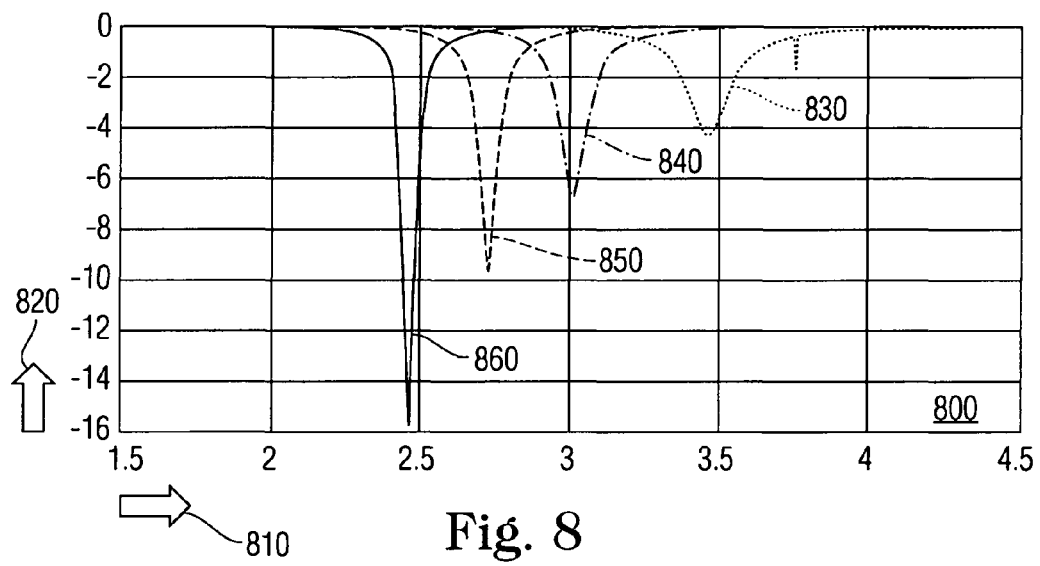
FIG. 8 is a plot view of reflected amplitude shift.

FIG. 8 shows a plot view 800 of reflected amplitude for the cellular structure 240. The abscissa 810 represents frequency in GHz, and ordinate 820 represents amplitude. Responses to light stimuli are shown for variable capacitances of 0.5 pF 830, 0.8 pF 840, 1.1 pF 850 and 1.4 pF 860, with attenuated changes in amplitude becoming more pronounced and sharper as capacitance value increases.

Figure 9:
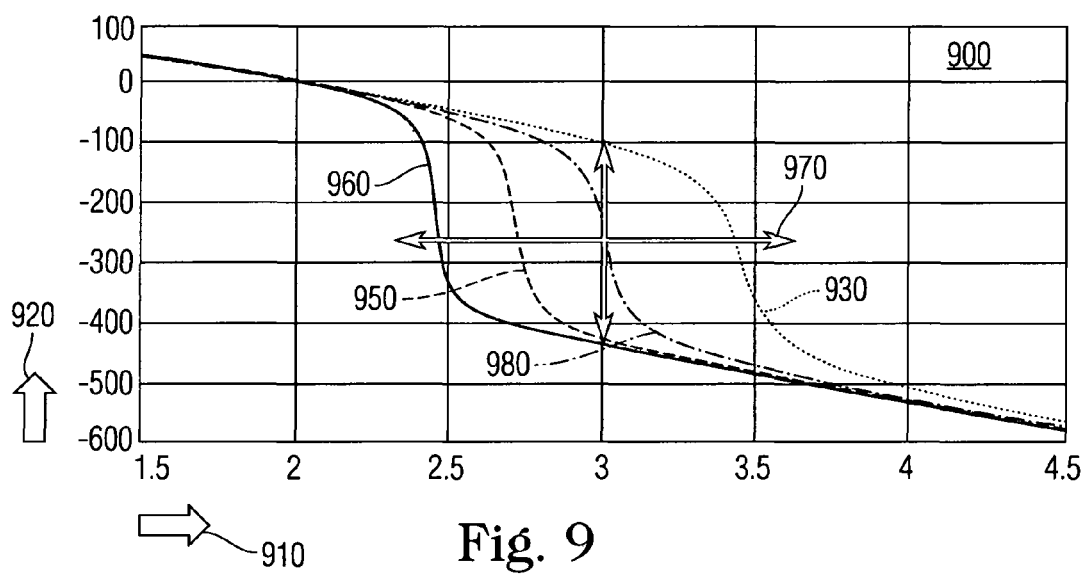
FIG. 9 is a plot view of reflected phase shift.

FIG. 9 shows a plot view 900 of reflected phase for the cellular structure 240. The abscissa 910 represents frequency in GHz, while the ordinate 920 represents phase shift in degrees, negative values indicating lag. Responses to light stimuli are shown for variable capacitances of 0.5 pF 930, 0.8 pF 940, 1.1 pF 950 and 1.4 pF 960, phase shifts extending to lower frequencies with increasing capacitance. The horizontal line represents optical sweep 970 up to 1.0 mW/cm$^2$, while the vertical line denotes phase sweep 980.

Exemplary embodiments provide that the light guide film assembly 110 can be multi-purpose using the exemplary metamaterial assemblies 210 and 310. For example, the optical power as guided by the LGF 120, can be used to both control the metamaterial and power a circuit in the metamaterial substrate 220. Multiple LGFs can be stacked with distinct extractor patterns. Electrical power can be generated using a photocell or photodiode device which converts optical energy to electrical energy. Multiple colors of light can be utilized: one to power the circuit, and one to control the circuit. Alternatively, a single color of light can be used that has sufficient energy to power the circuit, and where additional energy is used to control the circuit. The bumps in a metamaterial cell 360 can be co-located or separately located for control and power depending on the called for metamaterial application.

Further, device power and control can be obtained by utilizing different wavelength filters, selected from a set, above predetermined bumps on the light guide material. An arbitrary set or pattern of particular sensors on the grid of extractors 130 on the LGF 120 can thus be excited by the selection of color or set of colored light, where various colors means variation in wavelength and could include visible, infrared or other parts of the spectrum. The resulting color or multicolor illumination pattern on the grid can be interpreted to be a control command or power source to only select sensors in the total field of sensors. This is a technique to expand greatly the variety and flexibility of desired sensor responses.

Any electromagnetic application that utilizes controllable metamaterials can benefit from the disclosed embodiments. The exemplary solutions are inexpensive, efficient, and amendable to manufacturability. Controllable metamaterials are expected to be critical in military application because the military utilizes electromagnetic in so many ways.

Controllable metamaterials are also expected to be useful in civilian applications because the civilian uses of electromagnetics are extensive. Conventionally based alternatives include direct incorporation of LEDs into the metamaterial, which can interfere with the electromagnetic radiation to be control or mitigated as electrical power has to feed the LEDs through wires.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A metamaterial control device for controlling electromagnetic radiation, said device receiving a light emission, said device comprising:
a light-guide film (LGF) substrate having an edge surface for receiving the light emission, said LGF substrate being composed of metamaterial and having an extractor on a non-edge surface of the LGF substrate, said extractor scattering the light emission therefrom as scattered light;
an electromagnetic cell structure disposed on said LGF substrate around said extractor, said cell structure having first and second characteristics depending on intensity of said scattered light from said extractor; and
an optically sensitive component disposed to cover said extractor and provide said scattered light to said cell structure, wherein said cell structure shifts from said first characteristic to said second characteristic in response to receiving said scattered light from said component.

2. The device according to claim 1, in which said cell structure is a split-ring resonator.

3. The device according to claim 1, wherein said first characteristic is photocapacitance, and said second characteristic is one of capacitance and resistance.

4. The device according to claim 1, wherein said extractor corresponds to a protrusion on said LGF substrate.

5. A metamaterial control device for controlling electromagnetic radiation, said device being disposable a light-guide film (LGF), said LGF being capable of receiving a light emission on an edge surface, said device comprising:
a substrate disposed on the LGF, being composed of metamaterial and having an interface that corresponds to an extractor on a non-edge surface of the LGF, said extractor scatterings the light emission as scattered light;
an electromagnetic cell structure disposed on said substrate around said extractor, said cell structure having first and second characteristics depending on intensity of said scattered light from said extractor; and
an optically sensitive component disposed to cover said extractor and provide said scattered light to said cell structure, wherein said cell structure shifts from said first characteristic to said second characteristic in response to receiving said scattered light from said component.

6. The device according to claim 5, in which said cell structure is a split-ring resonator.

7. The device according to claim 5, wherein said first characteristic is photocapacitance, and said second characteristic is one of capacitance and resistance.

8. The device according to claim 5, wherein said extractor corresponds to a protrusion on said LGF.

9. The device according to claim 5, wherein said LGF comprises a plurality of light-guide films with distinguishable transmission frequencies.

10. A control device for controlling reactance in response to an emitted light, said device comprising:
a light-guide film (LGF) having an edge for receiving the emitted light and an extractor on one of obverse and reverse planar surfaces for scattering the emitted light as scattered light;
an electromagnetic cell structure disposed on said LGF around said extractor, said cell structure having first and second characteristics depending on intensity of said scattered light from said extractor; and
an optically sensitive component disposed to cover said extractor and provide said scattered light to said cell structure, wherein said cell structure shifts from said first characteristic to said second characteristic in response to receiving said scattered light from said component;
a junction disposed on a reverse planar surface; and
a via conduit disposed through said LGF for electrically connecting said cell structure and said junction.

11. The device according to claim 10, wherein said cell structure constitutes a metamaterial split-ring resonator.

12. The device according to claim 10, wherein said first characteristic is photocapacitance, and said second characteristic is one of capacitance, resistance and inductance.

13. The device according to claim 10, wherein said cell structure constitutes a metamaterial pad that interacts with an electric field more than with a corresponding magnetic field.

* * * * *